United States Patent
Pahl et al.

(10) Patent No.: US 6,931,699 B2
(45) Date of Patent: Aug. 23, 2005

(54) METHOD OF PRODUCING A SURFACE WAVE COMPONENT WITH A DRAIN FOR PYROELECTRIC VOLTAGE

(75) Inventors: Wolfgang Pahl, Munich (DE); Heiner Bayer, Olching (DE)

(73) Assignee: Epcos AG, Munich (DE)

( * ) Notice: Subject to any disclaimer, the term of this patent is extended or adjusted under 35 U.S.C. 154(b) by 219 days.

(21) Appl. No.: 10/169,854

(22) PCT Filed: Dec. 20, 2000

(86) PCT No.: PCT/DE00/04562

§ 371 (c)(1),
(2), (4) Date: Jul. 9, 2002

(87) PCT Pub. No.: WO01/52410

PCT Pub. Date: Jul. 19, 2001

(65) Prior Publication Data

US 2002/0190605 A1 Dec. 19, 2002

(30) Foreign Application Priority Data

Jan. 11, 2000 (DE) .......................... 100 00 746

(51) Int. Cl.[7] .................. H04R 17/00; H01L 41/04; H01L 41/08; H01L 41/18; H02N 2/00
(52) U.S. Cl. .......................... 29/25.35; 29/594; 29/846; 310/313 D; 310/313 R
(58) Field of Search ................. 29/25.35, 594, 29/846; 310/313 D, 313 R; 216/67, 73, 78

(56) References Cited

U.S. PATENT DOCUMENTS

| | | | | |
|---|---|---|---|---|
| 4,243,960 A | * | 1/1981 | White et al. | 333/196 |
| 4,952,832 A | * | 8/1990 | Imai et al. | 310/313 A |
| 5,343,107 A | * | 8/1994 | Shikata et al. | 310/313 A |
| 5,401,544 A | * | 3/1995 | Nakahata et al. | 427/585 |
| 5,700,349 A | * | 12/1997 | Tsukamoto et al. | 438/637 |
| 5,757,250 A | | 5/1998 | Ichikawa et al. | |

FOREIGN PATENT DOCUMENTS

| | | |
|---|---|---|
| EP | 0 785 620 A2 | 7/1997 |
| JP | 4-035312 | 2/1992 |
| JP | 9-153766 | 6/1997 |

* cited by examiner

Primary Examiner—A. Dexter Tugbang
Assistant Examiner—Tai Van Nguyen
(74) Attorney, Agent, or Firm—Fish & Richardson P.C.

(57) ABSTRACT

A method of producing a surface wave component with a drain for pyroelectric voltage includes forming electrically-conductive structures on a piezoelectric substrate. The structures form an acoustic path comprising an electroacoustic transducer. The method also includes forming a high-resistance layer on an entire surface of the substrate and on top of the electrically-conductive structures, and removing the high-resistance layer from at least a region corresponding to the electroacoustic transducer, such that at least a region outside the acoustic path remains covered by the high-resistance layer.

20 Claims, 2 Drawing Sheets

METHOD OF PRODUCING A SURFACE WAVE COMPONENT WITH A DRAIN FOR PYROELECTRIC VOLTAGE

CROSS-REFERENCE TO RELATED APPLICATIONS

This application claims priority to PCT Application No. PCT/DE00/04562, filed on Dec. 20, 2000, and to German Patent Application No. 100 00 746.5, filed on Jan. 11, 2000.

BACKGROUND

Pyroelectrical materials demonstrate the pyroelectric effect. In this connection, these materials react to temperature changes by building up an electrical voltage. This is particularly disadvantageous for components that are built up on pyroelectric substrates, for example, piezoelectric components or surface wave components. In this connection, such large voltages, i.e., field intensities, may build up between the electrically-conductive structures of these components, which have a more or less small size, and are applied directly on the pyroelectric substrate, that electrical sparkovers may occur between the small metal structures. As a result, the structures, and therefore the component, may be damaged or destroyed, unless suitable protective measures are taken.

Furthermore, the properties of the piezoelectric substrate material, and therefore also the component properties, may be irreversibly changed, or the component may actually become unusable, because of the high field intensities that occur. If the pyroelectrical voltages occur during operation of the component, the electrical fields or the sparkovers may trigger pulses between the electrically-conductive structures, which may result in incorrect signal processing in the electronic circuit.

Undesirable pyroelectrical voltages that are attributable to great changes in temperature occur particularly in the production of components with a pyroelectric substrate. A known means of preventing damage caused by pyroelectric charges is to provide ionization devices during production. By offering mobile charge carriers of a suitable amount and polarity in the ambient atmosphere of the pyroelectric substrate, the charges on the substrates, which are usually fixed in a specific location, may be compensated to a great extent. However, this is a technically complex method that is furthermore not suitable for all production processes. Also, a pyroelectric surface covered with electrically insulating or passivating layers may no longer be sufficiently discharged using ionization electrodes. Furthermore, the ionization electrodes are sensitive to various thin-layer methods and would also be damaged by the organic gas evolution that occurs in oven processes, for example.

From EP-A-0 785 620, it is known to protect components on pyroelectric substrates against damage caused by pyrodischarges, by means of conductive layers applied over the entire surface of the substrate, or under the component structures. A disadvantage in this connection is that the additional material layer may change the component properties in an unacceptable manner, and that the electroacoustic coupling or the spreading velocity of a surface wave is changed or actually attenuated.

Furthermore, it is possible to connect the metallic, electrically-conductive component structures conductively with one another, for example, by providing narrow metal strips that are structured to form a high-resistance connection, for example in a meander arrangement. However, these connections require a significant substrate area, which is counter to the increasing miniaturization of the components. Furthermore, because of their geometry, they are susceptible to electrical interruptions during the production process, particularly in the case of surface wave components, which may demonstrate a complicated arrangement and complicated wiring of several converter structures on a chip. It may be impossible, in some cases, to protect all the converters in this way, if there is not sufficient space available for the structures to be protected, and if the technologies used do not allow any crossing of printed conductors. The problem cannot always be solved even with additional bonded-wire contacts for connecting different electrically-conductive structures, and furthermore, this causes high costs.

SUMMARY

It is therefore the task of the present invention to specify a possibility of easily and harmlessly dissipating pyroelectrical voltages both during production and during operation of the components, for components with a pyroelectric substrate.

This task is accomplished, according to the invention, by means of a component specifies in claim 1. A method for production of the component, as well as advantageous embodiments of the invention, are found in the additional claims.

The invention specifies a component with electrically-conductive structures on a pyroelectric substrate material, in which the pyroelectrical voltages that occur are dissipated in a harmless manner, using a high-resistance layer. The properties of the high-resistance layer may be adapted to the component function, by varying the parameters of layer thickness, electrical conductivity, and type of layer material, in such a way that no negative impairment of the component function will occur. In this connection, it is possible to apply the high-resistance layer on the entire surface and subsequently to structure it. However, it is also possible to apply the high-resistance layer exclusively to those surfaces that are not covered by component structures, for example, by the electrically-conductive structures. A high-resistance layer in the sense of the invention is understood to mean a layer that demonstrates a resistance per area unit of at least $100\ \Omega/\nabla$ (ohm per square), up to $10^9\ \Omega/\nabla$.

The invention finds a particularly advantageous use in a surface wave component, for example in a surface wave filter, for which there is a particularly high risk of damage caused by the pyroelectric effect, because of the small structure widths of the electrically-conductive structures. Electrically-conductive structures that are provided in surface wave components are, in particular, electroacoustic transducers, reflectors, or printed conductors.

Preferably, the high-resistance layer in surface wave components is structured in such a way that at least the region of the electroacoustic transducers remains uncovered by the high-resistance layer. In this way, a negative impairment of the electroacoustic coupling or even an attenuation of the acoustical surface wave is prevented, which could represent a negative impairment of the component function.

Preferably, the high-resistance layer is a thin layer of a high-resistance material, particularly carbon or a semiconductor. These materials have the advantage that they may be applied over a large area, homogeneously, and in any desired layer thickness, as thinly as possible. Furthermore, suitable structuring methods are known for these materials, which allow the removal of the high-resistance layer, which has been applied over the entire area, in regions of the substrate surface that are supposed to be kept clear. Furthermore, the total conductivity of the layer may be easily adjusted in thin-layer methods, by way of the deposition conditions and the layer thickness selected.

In another embodiment of the invention, the high-resistance layer is an organic layer that is either intrinsically conductive because of the use of electrically-conductive polymers, or that contains electrically-conductive particles that result in sufficient conductivity for the high-resistance layer, as a whole. Such a layer has the advantage that it may be applied in a targeted manner, in specific regions of the substrate surface, by means of a printing process, for example. For this purpose, screen or template printing, dispensing or spraying of microdroplets, for example, according to the bubble jet method or the piezo jet method, are suitable. It is also possible to completely cure the high-resistance organic layer after it has been applied to the entire area, and to remove it from specific regions again later, in a simple manner, by wet chemistry or by using solvents. Also, direct photostructuring is possible, where curing of the organic layer, which has been applied in liquid form, takes place selectively in desired regions provided for the high-resistance layer, and subsequently, wet or dry development takes place by means of plasma etching or ion etching, where the organic layer acts like a photoresist.

Intrinsically conductive polymers are derived, for example, from aromatic compounds that contain nitrogen or sulfur atoms, such as aniline or thiophene, for example, as polyaniline. Carbon black and graphite are particularly suited as conductive particles. Thermoplastic polymers or reaction resins, particularly epoxy resins, may serve as the polymer matrix for the particles.

The method for the production of such a pyroprotected component, also according to the invention, will be explained in greater detail below, using exemplary embodiments and the associated 7 figures.

DETAILED DESCRIPTION

Figure 1:
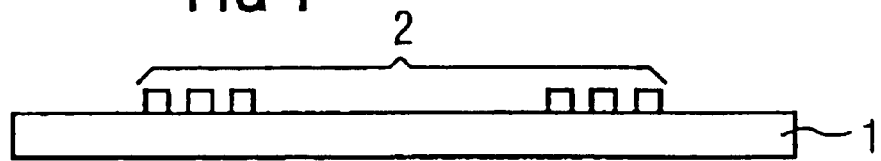
FIGS. 1 to 6 show different process steps in the production of a component according to the invention, using schematic cross-sections.

FIG. 1 shows a surface wave component in schematic cross-section. The component is structured on a piezoelectric substrate, for example, lithium niobate or lithium tantalate, which also has pyroelectrical properties. In the figure, two groups of three electrode fingers each are shown as representatives of possible electrically-conductive structures 2; they represent interdigital converters (electroacoustic transducers) and serve as the input or output converters for a surface wave filter. Electrically-conductive structures 2 are made up of aluminum, for example.

Figure 2:
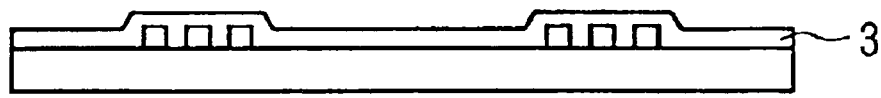

A high-resistance layer 3 is applied to the substrate surface, on top of electrically-conductive structures 2. For example, a carbon layer with a thickness of approximately 5 to 100 nm, for example 50 nm, is applied for this purpose, for example by means of sputtering it on. When using other high-resistance materials, other application methods and other layer thicknesses are also suitable. FIG. 2 shows the component with high-resistance layer 3 applied over the entire surface.

Since high-resistance layer 3 on top of the electrically-conductive structures 2 and, in general, in the converter region, may have negative effects on the properties of the surface wave component, structuring now takes place in such a manner that in this connection, at least the converter region, but even better, the entire acoustical path, is cleared of high-resistance layer 3.

Figure 3:

For this purpose, a plasma etching process using a resist etching mask may be used. FIG. 3 shows a resist layer 4 that has been applied over the entire surface of high-resistance layer 3. This may be centrifuged on, or it may also be applied as a dry film and laminated on.

Figure 4:
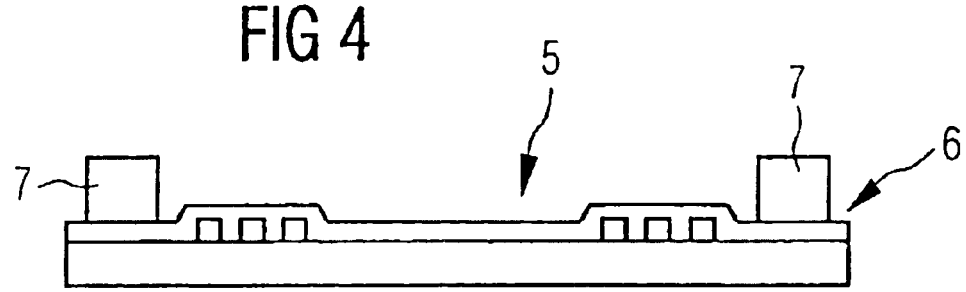
Figure 5:
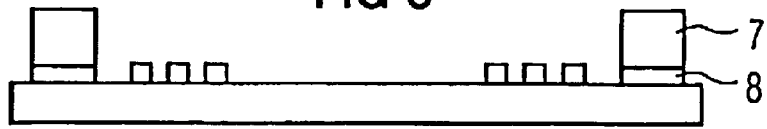

Resist film 4 is structured by means of photolithography, for example, where after exposure and development, resist structures 7 remain on high-resistance layer 3 outside of the region of converters 2. FIG. 4 shows the component in this stage.

Figure 7:
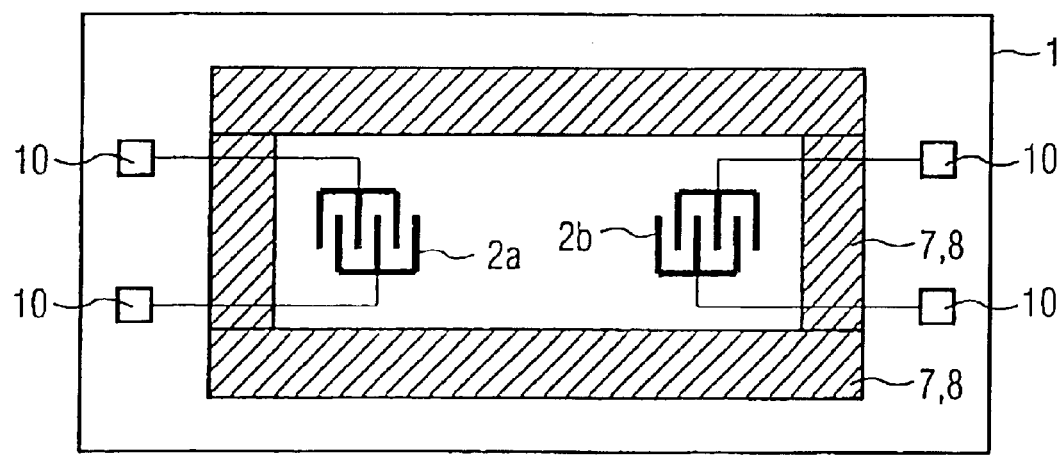
FIG. 7 shows a component with a structured high resistance layer, in a top view.

In a plasma etching process, for example, using a plasma containing oxygen, high-resistance layer 3, which is made up of carbon, for example, is not etched away in exposed regions 5 and, if necessary, 6, where resist structure 7 with high-resistance layer 8, which lies underneath it and is also structured, remains. FIG. 7 shows the component in this process step, in a schematic top view.

After the plasma etching process that has just been described, which may also be adapted for a different high-resistance layer material, for example, by using a plasma that contains halogen for a high-resistance layer 3 made of semiconductor material, high-resistance layer regions 8 remain around the two converters 2a and 2b, which regions are covered by the resist structure 7. These high-resistance layer regions 8 may completely surround converters 2 like a frame, for example. It is advantageous if the remaining resist structure 7 is used for a chip covering that is called PROTEC by the applicant. In this connection, the production of the high-resistance layer is integrated into the production process of the PROTEC covering. Such a PROTEC covering as well as a production method for it are known from WO95/30276, for example.

Figure 6:
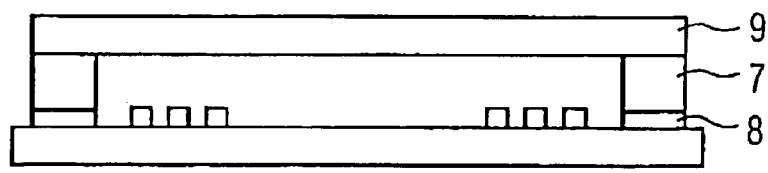

FIG. 6 shows how resist structure 7, which surrounds electrically-conductive structures 2 like a frame, for example, may be used as a support element for a covering layer 9. Using resist structure 7 as a protective and carrier element, a covering cap that tightly surrounds component structures 2 is created, together with the covering layer 9, by means of which component structures 2 may be tightly sealed to keep out ambient influences. Such a seal may also additionally take place by applying other materials to the PROTEC covering, where component structures 2 are protected against contact with these additional materials by the PROTEC covering, which forms a cavity.

As compared with the known PROTEC method, the method according to the invention, for production of the component with a pyroelectric drain 8, requires only the application of high-resistance layer 3 as an additional work step. Because of the small layer thickness of high-resistance layer 3, which is made of carbon, for example, removal of the high-resistance layer directly on top of electrically-conductive structures 2 and in the converter region may take place with only a short plasma etching step, as it has also previously been used as an intermediate step for cleaning of resist structure 7. Furthermore, high-resistance layer 3 that was applied to the entire surface may also serve as protection for electrically conductive structures 2, while resist layer 4 is developed by means of wet chemistry, and, in particular, in an aqueous alkaline manner, for the production of resist structure 7. In this way, the aluminum of the electrically conductive structures is protected against attack by the alkaline developer, which otherwise could result in removal of part of the aluminum, which again could have negative effects on the component properties.

In another exemplary embodiment, a reaction resin that is filled with carbon black may be cured with UV is applied to the substrate in a layer thickness of 5 μm, for example, as the high-resistance layer. Structuring may take place directly by way of structuring exposure via a mask, or with laser writing. After removal of the uncured regions by means of dry or wet chemical processes, a short oxygen plasma treatment of the entire surface may follow, in order to incinerate any individual electrically-conductive (carbon black) particles that remain, and thereby to remove them from the locations at which they could cause a short circuit or disrupt the further processing of the component in some other manner.

The high-resistance layer may be part of a passivating protective covering.

Using the method according to the invention, which has been described on the basis of an exemplary embodiment, high-resistance layer 3 may be structured to produce high-resistance layer regions 8 with any desired shape, which may also be structured differently from the embodiment shown in FIG. 7. In this connection, it is advantageous but not necessary to combine the structuring process with the PROTEC process.

Using the invention, electrically-conductive frames may be produced around component structures, component structures may be bridged in high-resistance manner, or several components may be connected with one another on a single wafer, in order to create large-area equipotential surfaces in this way. Furthermore, it is possible to structure the high-resistance layer in such a way that it may be used to attenuate undesirable wave components or to prevent undesirable reflections.

Using the invention, a component is obtained in which different surface regions are connected with one another in a high-resistance manner, so that any pyroelectrical voltages that build up on the surface of substrate 1, and particularly between different electrically-conductive structures 2, may be slowly but safely discharged via the high-resistance connection. Damage to the component during operation, or during additional production steps, is reliably prevented in this manner. In this connection, the method may already be used in the wafer stage, and is not limited to protecting individual chips or components.

What is claimed is:

1. A method of producing a surface wave component with a drain for pyroelectric voltage, the method comprising:
   forming electrically-conductive structures on a piezoelectric substrate, the structures forming an acoustic path comprising an electroacoustic transducer;
   forming a high-resistance layer on an entire surface of the substrate and on top of the electrically-conductive structures; and
   removing the high-resistance layer from at least a region corresponding to the electroacoustic transducer, such that at least a region outside the acoustic path remains covered by e high-resistance layer.

2. The method of claim 1, wherein the high-resistance layer is applied using a thin-layer method.

3. The method of claim 1, wherein, to form the high-resistance layer, a layer of carbon or a semiconductor is sputtered on the substrate.

4. The method of claim 1, wherein the high-resistance layer is removed using plasma etching and a resist mask.

5. The method of claim 4, wherein parts of a covering that is applied on top of the electrically-conductive structures are used as the resist mask, the covering comprising a photo-structured layer.

6. The method of claim 1, wherein the high resistance layer comprises a layer of carbon with a thickness of 5–100 nm, the layer of carbon being removed using plasma containing oxygen and a resist mask.

7. The method of claim 1, wherein the high-resistance layer comprises an attenuation structure.

8. The method of claim 1, wherein the region corresponding to the electroacoustic transducer is an active region of the electrically-conductive structures.

9. The method of claim 1, wherein the high-resistance layer in the region outside the acoustic forms the drain for pyroelectric voltage.

10. The method of claim 1, wherein the high-resistance layer in the region outside the acoustic forms a frame around the region corresponding to the electroacoustic transducer.

11. The method of claim 10, wherein the frame is part of a passivating protective covering.

12. A method of producing a surface wave component with a drain for pyroelectric voltage, the method comprising:
   forming electroacoustic transducers on a piezoelectric substrate;
   forming an electrically-conductive layer on an entire surface of the substrate and on top of the electroacoustic transducers; and
   removing the electrically-conductive layer from a region corresponding to the electroacoustic transducers, such that the remaining electrically-conductive layer forms the drain for pyroelectric voltage.

13. The method of claim 12, wherein the electrically-conductive layer is applied using a thin-layer method.

14. The method of claim 12, wherein, to form the electrically-conductive layer, a layer of carbon or a semiconductor is sputtered on the substrate.

15. The method of claim 12, wherein the electrically-conductive layer is removed using plasma etching and a resist mask.

16. The method of claim 15, wherein parts of a covering that is applied on top of the electroacoustic transducers are used as the resist mask, the covering comprising a photo-structured layer.

17. The method of claim 12, wherein the electrically-conductive layer comprises a layer of carbon with a thickness of 5–100 nm, the layer of carbon being removed using plasma containing oxygen an a resist mask.

18. The method of claim 12, wherein the electrically-conductive layer comprises an attenuation structure.

19. The method of claim 12, wherein the remaining high-resistance layer forms a frame around the region corresponding to the electroacoustic transducers.

20. The method of claim 19, wherein the frame is part of a passivating protective covering.

* * * * *

UNITED STATES PATENT AND TRADEMARK OFFICE
CERTIFICATE OF CORRECTION

| | |
|---|---|
| PATENT NO. | : 6,931,699 B2 |
| APPLICATION NO. | : 10/169854 |
| DATED | : August 23, 2005 |
| INVENTOR(S) | : Wolfgang Pahl and Heiner Bayer |

Page 1 of 1

It is certified that error appears in the above-identified patent and that said Letters Patent is hereby corrected as shown below:

<u>In the Claims</u>:

Column 5, Line 60, Claim 1
    Delete the word "e", and replace with the word --the--.

Column 6, Line 54, Claim 17
    Delete the word "an", and replace with the word --and--.

Signed and Sealed this

Thirtieth Day of January, 2007

JON W. DUDAS
*Director of the United States Patent and Trademark Office*